(12) United States Patent
Kim

(10) Patent No.: US 11,664,789 B1
(45) Date of Patent: May 30, 2023

(54) SEMICONDUCTOR DEVICE USING PIPE CIRCUIT

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/685,575

(22) Filed: Mar. 3, 2022

(30) Foreign Application Priority Data

Nov. 17, 2021 (KR) .......................... 10-2021-0158953

(51) Int. Cl.
*G11C 7/10* (2006.01)
*H03K 3/037* (2006.01)

(52) U.S. Cl.
CPC .............. *H03K 3/037* (2013.01); *G11C 7/106* (2013.01); *G11C 7/1051* (2013.01); *G11C 7/1066* (2013.01)

(58) Field of Classification Search
CPC ..... G11C 7/1051; G11C 7/106; G11C 7/1066; H03K 3/037
See application file for complete search history.

(56) References Cited

U.S. PATENT DOCUMENTS

| 7,843,743 B2 * | 11/2010 | Bae ...................... G11C 7/106 |
| | | 365/219 |
| 2004/0095178 A1 * | 5/2004 | Bang ..................... G11C 7/103 |
| | | 327/215 |

FOREIGN PATENT DOCUMENTS

KR          1020080092681 A          10/2008

* cited by examiner

*Primary Examiner* — Patrick O Neill
(74) *Attorney, Agent, or Firm* — William Park & Associates Ltd.

(57) ABSTRACT

A semiconductor device includes an output control circuit configured to generate a pre-output control signal and an output control signal according to the number of times that an output strobe pulse is inputted. The semiconductor device also includes a pipe circuit configured to generate latched data by latching input data on the basis of an input control signal, select some bits of the bits of the latched data and set the selected bits to pre-output data on the basis of the pre-output control signal, and output the pre-output data as output data on the basis of the output control signal.

20 Claims, 16 Drawing Sheets

SEMICONDUCTOR DEVICE USING PIPE CIRCUIT

CROSS-REFERENCES TO RELATED APPLICATIONS

The present application claims priority under 35 U.S.C. § 119(a) to Korean application number 10-2021-0158953, filed in the Korean Intellectual Property Office on Nov. 17, 2021, the entire disclosure of which is incorporated herein by reference.

BACKGROUND

The present disclosure relates to a semiconductor device using a pipe circuit.

A semiconductor device includes a pipe circuit to efficiently process data which are successively transmitted. The pipe circuit may include a plurality of latch circuits configured to latch data inputted in synchronization with input timings, and output the latched data in synchronization with output timings.

SUMMARY

Some embodiments of the present disclosure are directed to a semiconductor device using a pipe circuit.

In an embodiment, a semiconductor device may include: an output control circuit configured to generate a pre-output control signal and an output control signal according to the number of times that an output strobe pulse is inputted. The semiconductor device may also include a pipe circuit configured to generate latched data by latching input data on the basis of an input control signal, select some bits of the bits of the latched data and set the selected bits to pre-output data on the basis of the pre-output control signal, and output the pre-output data as output data on the basis of the output control signal.

In another embodiment, a semiconductor device may include a first pipe latch circuit configured to: select one of input data latched in a first node and the input data latched in a second node according to the logic level of a pre-output control signal and set the selected data to a first bit of pre-output data, and output the first bit of the pre-output data as output data when a first bit of an output control signal is activated. The semiconductor device may also include a second pipe latch circuit configured to: select one of the input data latched in a third node and the input data latched in a fourth node according to the logic level of the pre-output control signal and set the selected data to a second bit of the pre-output data, and output the second bit of the pre-output data as the output data when a second bit of the output control signal is activated. The semiconductor device may further include an output control circuit configured to change the logic level of the pre-output control signal in synchronization with the first bit of the output control signal.

In still another embodiment, a semiconductor device may include a first pipe latch circuit configured to: select one of input data latched in a first node and the input data latched in a second node according to the logic level of a first pre-output control signal and set the selected data to a first bit of pre-output data, and output the first bit of the pre-output data as output data when a first bit of an output control signal is activated. The semiconductor device may also include a second pipe latch circuit configured to: select one of the input data latched in a third node and the input data latched in a fourth node according to the logic level of a second pre-output control signal and set the selected data to a second bit of the pre-output data, and output the second bit of the pre-output data as the output data when a second bit of the output control signal is activated. The semiconductor device may further include an output control circuit configured to change the logic level of the second pre-output control signal in synchronization with the first bit of the output control signal.

In accordance with some embodiments, the semiconductor device in accordance with the present disclosure may set, to the pre-output data, only some bits which are selected according to the number of times that the output data is outputted, among the bits of data latched in the pipe circuit, and output the pre-output data as the output data in synchronization with output timings, when outputting the latched data as the output data, thereby reducing the loading of the node to which the output data is outputted from the pipe circuit.

DETAILED DESCRIPTION

In the descriptions of the following embodiments, the term "preset" indicates that the value of a parameter is previously determined, when the parameter is used in a process or algorithm. According to different embodiments, the value of the parameter may be set when the process or algorithm is started or while the process or algorithm is performed.

Terms such as "first" and "second", which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components may be directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Figure 1:
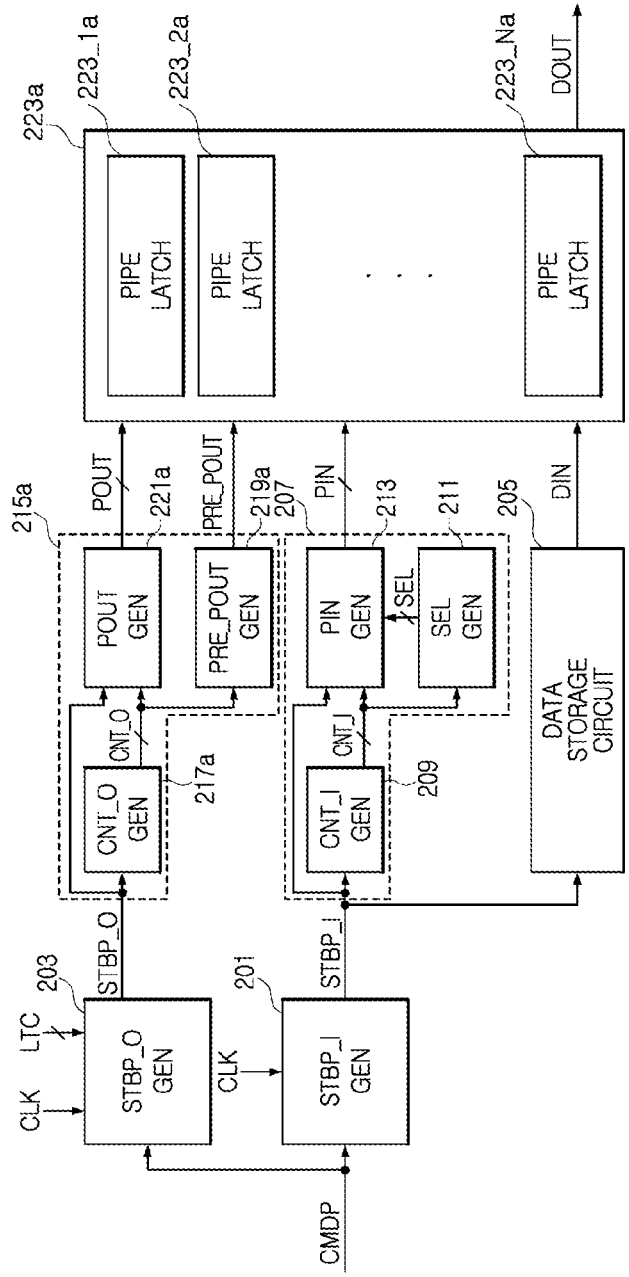
FIG. 1 is a block diagram illustrating a configuration of a semiconductor device in accordance with an embodiment.

FIG. 1 is a block diagram illustrating a configuration of a semiconductor device 100a in accordance with an embodiment. As illustrated in FIG. 1, the semiconductor device 100a may include an input strobe pulse generation circuit (STBP_I GEN) 201, an output strobe pulse generation circuit (STBP_O GEN) 203, a data storage circuit 205, an input control circuit 207, an output control circuit 215a, and a pipe circuit 223a. The semiconductor device 100a may receive a command (not illustrated) and a clock CLK from an external device (not illustrated), and may perform various internal operations including a read operation.

The input strobe pulse generation circuit 201 may generate an input strobe pulse STBP_I from a command pulse CMDP in synchronization with the clock CLK. The command pulse CMDP may be generated from a command (not illustrated) for performing a read operation. The input strobe pulse generation circuit 201 may generate the input strobe pulse STBP_I from the command pulse CMDP whenever a read operation is performed.

The output strobe pulse generation circuit 203 may generate an output strobe pulse STBP_O by delaying the command pulse CMDP by read latency on the basis of a latency signal LTC in synchronization with the clock CLK. The latency signal LTC may include a combination of bits, corresponding to the read latency. The latency signal LTC may be stored and outputted by a mode register (not illustrated). The output strobe pulse generation circuit 203 may generate the output strobe pulse STBP_O by delaying the command pulse CMDP by the read latency, whenever a read operation is performed.

The data storage circuit 205 may include a plurality of cell arrays (not illustrated) configured to store input data DIN. The data storage circuit 205 may output the input data DIN stored in the cell arrays in synchronization with the input strobe pulse STBP_I.

The input control circuit 207 may include an input count signal generation circuit (CNT_I GEN) 209, a select signal generation circuit (SEL GEN) 211, and an input control signal generation circuit (PIN GEN) 213. The input control circuit 207 may generate an input control signal PIN on the basis of the input strobe pulse STBP_I. The input control signal PIN may include first to $2N^{th}$ bits. Here, 'N' may be set to a natural number equal to or greater than 2. The input control circuit 207 may sequentially activate the bits of the input control signal PIN according to the number of times that the input strobe pulse STBP_I is inputted. For example, the input control circuit 207 may activate a first bit PIN<1> of the input control signal when the input strobe pulse STBP_I is inputted for the first time, and activate a second bit PIN<2> of the input control signal when the input strobe pulse STBP_I is inputted for the second time. Then, the input control circuit 207 reactivate the first bit PIN<1> of the input control signal when the input strobe pulse STBP_I is inputted for the $(2N+1)^{th}$ time.

The input count signal generation circuit 209 may sequentially activate the bits of the input count signal CNT_I by counting the number of times that the input strobe pulse STBP_I is inputted. The input count signal CNT_I may include first to $N^{th}$ bits. For example, the input count signal generation circuit 209 may activate a first bit CNT_I<1> of the input count signal when the input strobe pulse STBP_I is inputted for the first time, and activate a second bit CNT_I<2> of the input count signal when the input strobe pulse STBP_I is inputted for the second time. Then, the input count signal generation circuit 209 may reactivate the first bit CNT_I<1> of the input count signal when the input strobe pulse STBP_I is inputted for the $(N+1)^{th}$ time. The configuration and operation of the input count signal generation circuit 209 will be described below in detail with reference to FIG. 2.

The select signal generation circuit 211 may generate a select signal SEL on the basis of the input count signal CNT_I. The select signal generation circuit 211 may change the logic level of the select signal SEL in synchronization with a preset bit among the bits of the input count signal CNT_I. For example, the select signal generation circuit 211 may change the logic level of the select signal SEL in synchronization with an $N^{th}$ bit CNT_I<N> of the input count signal. The number of bits included in the select signal SEL may be set to various values in different embodiments. The configuration and operation of the select signal generation circuit 211 will be described below in detail with reference to FIG. 3.

The input control signal generation circuit 213 may generate the input control signal PIN from the input strobe pulse STBP_I on the basis of the input count signal CNT_I and the select signal SEL. The input control signal generation circuit 213 may output the input strobe pulse STBP_I as one of the bits of the input control signal PIN, according to a logic level combination of the input count signal CNT_I and the logic level of the select signal SEL. For example, when the select signal SEL has a first logic level, the input control signal generation circuit 213 may output the input strobe pulse STBP_I as one of the first to $N^{th}$ bits PIN<1:N> of the input control signal according to the logic level combination of the input count signal CNT_I. When the select signal SEL has a second logic level, the input control signal generation circuit 213 may output the input strobe pulse STBP_I as one of the $(N+1)^{th}$ to 2N bits PIN<N+1:2N+1> of the input control signal according to the logic level combination of the input count signal CNT_I. The configuration and operation of the input control signal generation circuit 213 will be described below in detail with reference to FIG. 4.

The output control circuit 215a may include an output count signal generation circuit (CNT_O GEN) 217a, a pre-output control signal generation circuit (PRE_POUT GEN) 219a, and an output control signal generation circuit (POUT GEN) 221a. The output control circuit 215a may generate an output control signal POUT and a pre-output control signal PRE_POUT on the basis of the output strobe pulse STBP_O. The output count signal POUT may include first to $N^{th}$ bits. The output control circuit 215a may sequentially activate the bits of the output control signal POUT according to the number of times that the output strobe pulse STBP_O is inputted. For example, the output control circuit 215a may activate a first bit POUT<1> of the output control signal when the output strobe pulse STBP_O is inputted for the first time, and activate a second bit POUT<2> of the output control signal when the output strobe pulse STBP_O is inputted for the second time. Then, the output control circuit 215a may reactivate the first bit POUT<1> of the output control signal when the output strobe pulse STBP_O is inputted for the $(N+1)^{th}$ time. The output control circuit 215a may generate the pre-output control signal PRE_POUT according to the number of times that the output strobe pulse STBP_O is inputted. More specifically, the output control circuit 215a may change the logic level of the pre-output control signal PRE_POUT in synchronization with a preset bit among the bits of the output control signal POUT. For example, the output control circuit 215a may change the logic level of the pre-output control signal PRE_POUT in synchronization with an $N^{th}$ bit POUT<N> of the output count signal.

The output count signal generation circuit 217a may sequentially activate the bits of an output count signal CNT_O by counting the number of times that the output strobe pulse STBP_O is inputted. The output count signal CNT_O may include first to $N^{th}$ bits. For example, the output count signal generation circuit 217a may activate a first bit CNT_O<1> of the output count signal when the output strobe pulse STBP_O is inputted for the first time, and activate a second bit CNT_O<2> of the output count signal when the output strobe pulse STBP_O is inputted for the second time. Then, the output count signal generation circuit 217a may reactivate the first bit CNT_O<1> of the output count signal when the output strobe pulse STBP_O is inputted for the $(N+1)^{th}$ time. The configuration and operation of the output count signal generation circuit 217a will be described below in detail with reference to FIG. 6.

The pre-output control signal generation circuit 219a may generate the pre-output control signal PRE_POUT on the basis of the output count signal CNT_O. The pre-output control signal generation circuit 219a may change the logic level of the pre-output control signal PRE_POUT in synchronization with a preset bit among the bits of the output count signal CNT_O. For example, the pre-output control signal generation circuit 219a may change the logic level of the pre-output control signal PRE_POUT in synchronization with an $N^{th}$ bit CNT_O<N> of the output count signal. The configuration and operation of the pre-output control signal generation circuit 219a will be described below in detail with reference to FIG. 7.

The output control signal generation circuit 221a may generate the output control signal POUT from the output strobe pulse STBP_O on the basis of the output count signal CNT_O. The output control signal generation circuit 221a may output the output strobe pulse STBP_O as one of the bits of the output control signal POUT according to the logic level combination of the output count signal CNT_O. For example, the output control signal generation circuit 221a may output the output strobe pulse STBP_O as one of the first to $N^{th}$ bits POUT<1:N> of the output control signal according to the logic level combination of the output count signal CNT_O. The configuration and operation of the output control signal generation circuit 221a will be described below in detail with reference to FIG. 8.

The pipe circuit 223a may include a plurality of pipe latch circuits 223_1a to 223_Na. The pipe circuit 223a may generate latched data (not illustrated) by latching the input data DIN on the basis of the input control signal PIN, may select some bits of the latched data and set the selected bits as pre-output data (not illustrated) on the basis of the pre-output control signal PRE_POUT, and may output the pre-output data as output data DOUT on the basis of the output control signal POUT.

The pipe circuit 223a may generate first to $N^{th}$ bits of the latched data by latching the input data DIN on the basis of the first to $N^{th}$ bits PIN<1:N> of the input control signal. More specifically, the pipe circuit 223a may generate a $K^{th}$ bit of the latched data by latching the input data DIN, when a $K^{th}$ bit PIN<K> of the input control signal is activated. Here, 'K' is a natural number equal to or less than 'N.' For example, the pipe circuit 223a may generate the first bit of the latched data by latching the input data DIN when the first bit PIN<1> of the input control signal is activated, and generate the second bit of the latched data by latching the input data DIN when the second bit PIN<2> of the input control signal is activated.

The pipe circuit 223a may generate $(N+1)^{th}$ to $2N^{th}$ bits of the latched data by latching the input data DIN on the basis of the $(N+1)^{th}$ to $2N^{th}$ bits PIN<N+1:2N> of the input control signal. More specifically, the pipe circuit 223a may generate an $(N+K)^{th}$ bit of the latched data by latching the input data DIN, when an $(N+K)^{th}$ bit PIN<N+K> of the input control signal is activated. For example, the pipe circuit 223a may generate the $(N+1)^{th}$ bit of the latched data by latching the input data DIN when the $(N+1)^{th}$ bit PIN<N+1> of the input control signal is activated, and may generate the $(N+2)^{th}$ bit of the latched data by latching the input data DIN when the $(N+2)^{th}$ bit PIN<N+2> of the input control signal is activated.

The pipe circuit 223a may select some bits among the bits of the latched data according to the logic level of the pre-output control signal PRE_POUT, and set the selected bits as the bits of the pre-output data. For example, when the pre-output control signal PRE_POUT has a first logic level, the pipe circuit 223a may select the first to $N^{th}$ bits among the first to $2N^{th}$ bits of the latched data, and set the selected bits to the first to $N^{th}$ bits of the pre-output data, respectively. When the pre-output control signal PRE_POUT has a second logic level, the pipe circuit 223a may select the $(N+1)^{th}$ to 2N bits among the first to $2N^{th}$ bits of the latched data, and set the selected bits as the first to $N^{th}$ bits of the pre-output data, respectively. Thus, the pipe circuit 223a may set, to the pre-output data, only some bits which are selected according to the number of times that the output data DOUT is outputted, among the bits of the latched data, on the basis of the pre-output control signal PRE_POUT, thereby reducing the loading of a node from which the output data DOUT is outputted.

The pipe circuit 223a may output the first to $N^{th}$ bits of the pre-output data as the output data DOUT on the basis of the first to $N^{th}$ bits POUT<1:N> of the output control signal. More specifically, when the $K^{th}$ POUT<K> of the output control signal is activated, the pipe circuit 223a may output the $K^{th}$ bit of the pre-output data as the output data DOUT. For example, the pipe circuit 223a may output the first bit of the pre-output data as the output data DOUT, when the first bit POUT<1> of the output control signal is activated, and may output the second bit of the pre-output data as the output data DOUT, when the second bit POUT<2> of the output control signal is activated.

The plurality of pipe latch circuits 223_1a to 223_Na may latch the input data DIN on the basis of the $K^{th}$ bit PIN<K> of the input control signal, the $(N+K)^{th}$ bit PIN<N+K> of the input control signal, the pre-output control signal PRE_POUT, and the $K^{th}$ bit POUT<K> of the output control signal, and output the latched data as the output data DOUT. For example, a first pipe latch circuit 223_1a may generate the first bit of the latched data by latching the input data DIN, when the first bit PIN<1> of the input control signal is activated. The first pipe latch circuit 223_1a may generate the $(N+1)^{th}$ bit of the latched data by latching the input data DIN, when the $(N+1)^{th}$ bit PIN<N+1> of the input control signal is activated. The first pipe latch circuit 223_1a may select one of the first bit and the $(N+1)^{th}$ bit of the latched data according to the logic level of the pre-output control signal PRE_POUT, and set the selected bit to the first bit of the pre-output data. When the first POUT<1> of the output control signal is activated, the first pipe latch circuit 223_1a may output the first bit of the pre-output data as the output data DOUT.

When the $K^{th}$ bit PIN<K> of the input control signal is activated, the pre-output control signal PRE_POUT may have a logic level for setting the $K^{th}$ bit of the latched data to the $K^{th}$ bit of the pre-output data. For example, the first pipe latch circuit 223_1a may generate the first bit of the latched data by latching the input data DIN, when the first bit PIN<1> of the input control signal is activated, and may set the first bit of the latched data to the first bit of the pre-output data according to the logic level of the pre-output control signal PRE_POUT. When the $(N+K)^{th}$ bit PIN<N+K> of the input control signal is activated, the pre-output control signal PRE_POUT may have a logic level for setting the $(N+K)^{th}$ bit of the latched data to the $K^{th}$ bit of the pre-output data. For example, the first pipe latch circuit 223_1a may generate the $(N+1)^{th}$ bit of the latched data by latching the input data DIN, when the $(N+1)^{th}$ bit PIN<N+1> of the input control signal is activated, and may set the $(N+1)^{th}$ bit of the latched data to the first bit of the pre-output data according to the logic level of the pre-output control signal PRE_POUT.

The $K^{th}$ bit POUT<K> of the output control signal may be activated after a delay time has elapsed from the point in time when one of the $K^{th}$ bit PIN<K> and the $(N+K)^{th}$ bit PIN<N+K) of the input control signal was activated, the delay time being varied according to the read latency. For example, when the delay time has elapsed after the first bit PIN<1> of the input control signal was activated, the first pipe latch circuit 223_1a may output the first bit of the pre-output data as the output data DOUT on the basis of the first bit POUT<1> of the output control signal. When the delay time has elapsed after the $(N+1)^{th}$ bit PIN<N+1> of the input control signal was activated, the first pipe latch circuit 223_1a may output the first bit of the pre-output data as the output data DOUT on the basis of the first bit POUT<1> of the output control signal. The configuration and operation of the pipe circuit 223a will be described below in detail with reference to FIG. 10.

Figure 2:
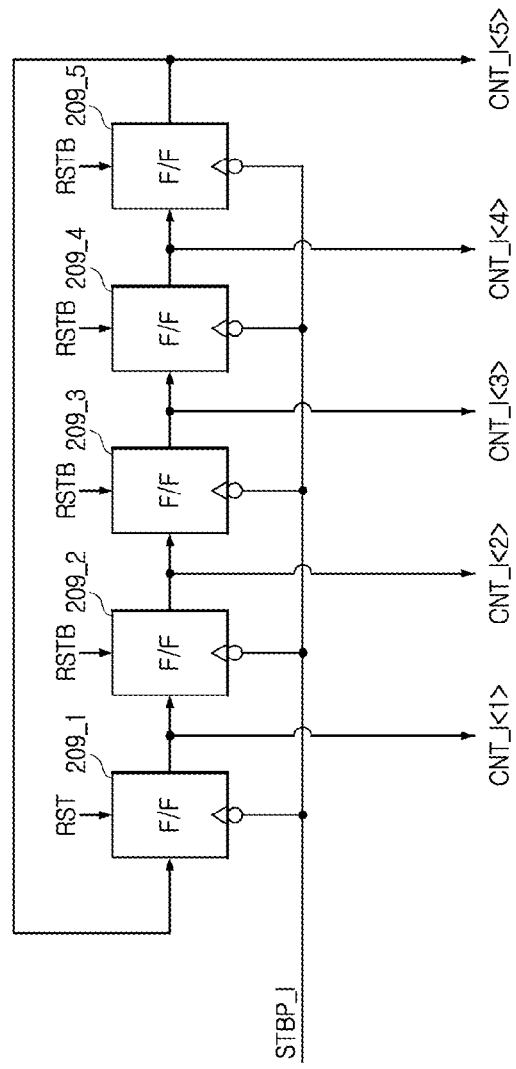
FIG. 2 is a circuit diagram illustrating an example of an input count signal generation circuit included in an input control circuit illustrated in FIG. 1.

FIG. 2 is a circuit diagram illustrating an example of the input count signal generation circuit 209 included in the input control circuit 207 illustrated in FIG. 1. As illustrated in FIG. 2, the input count signal generation circuit 209 may include flip-flops 209_1 to 209_5.

The flip-flops 209_1 to 209_5 may set a logic level combination of the first to fifth bits CNT_I<1:5> of the input count signal to 'H, L, L, L, L,' when an initialization operation is performed on the basis of a reset signal RST and an inverted reset signal RSTB. The reset signal RST and the inverted reset signal RSTB may have a logic high level and a logic low level, respectively, when the initialization operation is performed. The flip-flops 209_1 to 209_5 may sequentially change the logic level combination of the first to fifth bits CNT_I<1:5> of the input count signal according to the number of times that the input strobe pulse STBP_I is inputted. For example, when the input strobe pulse STBP_I is inputted for the first time after the initialization operation is performed, the flip-flops 209_1 to 209_5 may set the logic level combination of the first to fifth bits CNT_I<1:5> of the input count signal to 'L, H, L, L, L.' When the input strobe pulse STBP_I is inputted for the second time after the initialization operation is performed, the flip-flops 209_1 to 209_5 may set the logic level combination of the first to fifth bits CNT_I<1:5> of the input count signal to 'L, L, H, L, L.'

Figure 3:
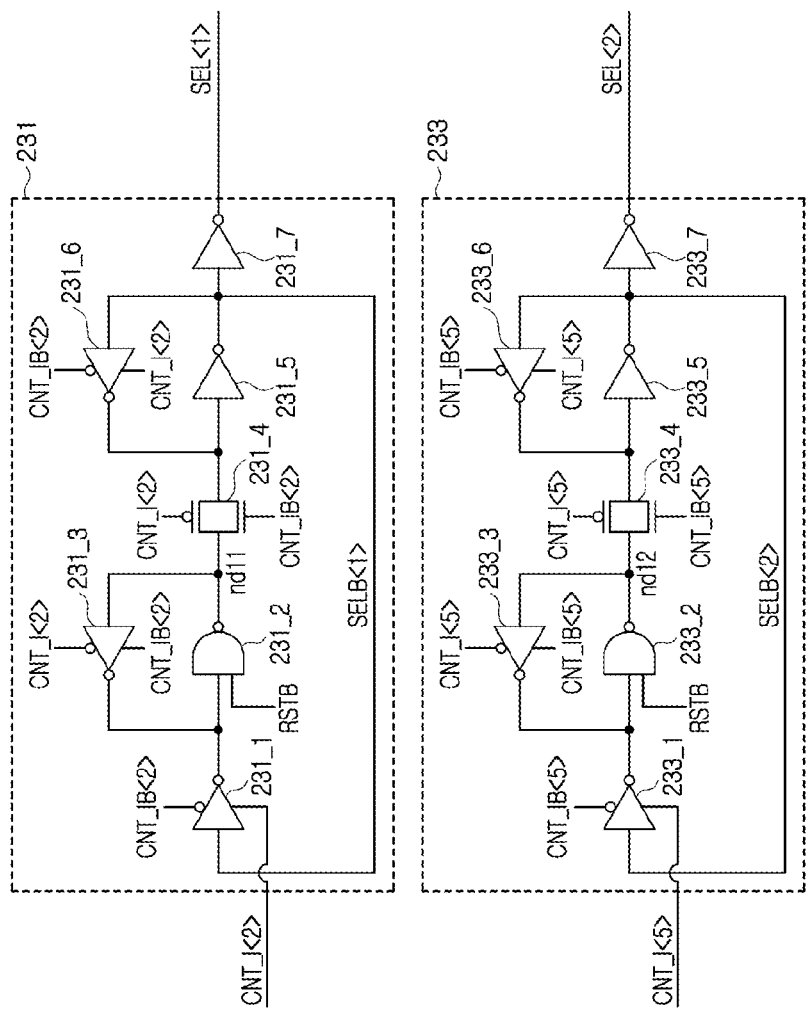
FIG. 3 is a circuit diagram illustrating an example of a select signal generation circuit included in the input control circuit illustrated in FIG. 1.

FIG. 3 is a circuit diagram illustrating an example of the select signal generation circuit 211 included in the input control circuit 207 illustrated in FIG. 1. As illustrated in FIG. 3, the select signal generation circuit 211 may include a first select signal generation circuit 231 and a second select signal generation circuit 233.

The first select signal generation circuit 231 may include inverters 231_1, 231_3, 231_5, 231_6, and 231_7, a NAND gate 231_2, and a pass transistor 231_4. The first select signal generation circuit 231 may change the logic level of a first bit SEL<1> of the select signal in synchronization with a falling edge of the second bit CNT_I<2> of the input count signal.

When the second bit CNT_I<2> of the input count signal and a second bit CNT_IB<2> of an inverted input count signal have a logic high level and a logic low level, respectively, the first select signal generation circuit 231 may buffer a first bit SELB<1> of an inverted select signal through the inverter 231_1 and the NAND gate 231_2 and output the buffered bit through a node nd11. The second bit CNT_IB<2> of the inverted input count signal may be generated by inverting the logic level of the second bit CNT_I<2> of the input count signal. The first select signal generation circuit 231 may set the node nd11 to a logic high level through the NAND gate 231_2 on the basis of the inverted reset signal RSTB which has a logic low level during the initialization operation.

When the second bit CNT_I<2> of the input count signal and the second bit CNT_IB<2> of the inverted input count signal have a logic low level and a logic high level, respectively, the first select signal generation circuit 231 may latch the signal of the node nd11 through the NAND gate 231_2 and the inverter 231_3, and invert and buffer the signal of the node nd11 through the pass transistor 231_4 and the inverter 231_5 and output the inverted and buffered signal as the first bit SELB<1> of the inverted select signal.

When the second bit CNT_I<2> of the input count signal and the second bit CNT_IB<2> of the inverted input count signal have a logic high level and a logic low level, respectively, the first select signal generation circuit 231 may latch the first bit SELB<1> of the inverted select signal through the inverters 231_5 and 231_6.

The first select signal generation circuit 231 may invert and buffer the first bit SELB<1> of the inverted select signal through the inverter 231_7, and output the inverted and buffered bit as the first bit SEL<1> of the select signal.

The second select signal generation circuit 233 may include inverters 233_1, 233_3, 233_5, 233_6, and 233_7, a NAND gate 233_2, and a pass transistor 233_4. The second select signal generation circuit 233 may change the logic level of a second bit SEL<2> of the select signal in synchronization with a falling edge of the fifth bit CNT_I<5> of the input count signal. The operation of the second select signal generation circuit 233 is implemented in the same manner as the operation of the first select signal generation circuit 231.

Figure 4:
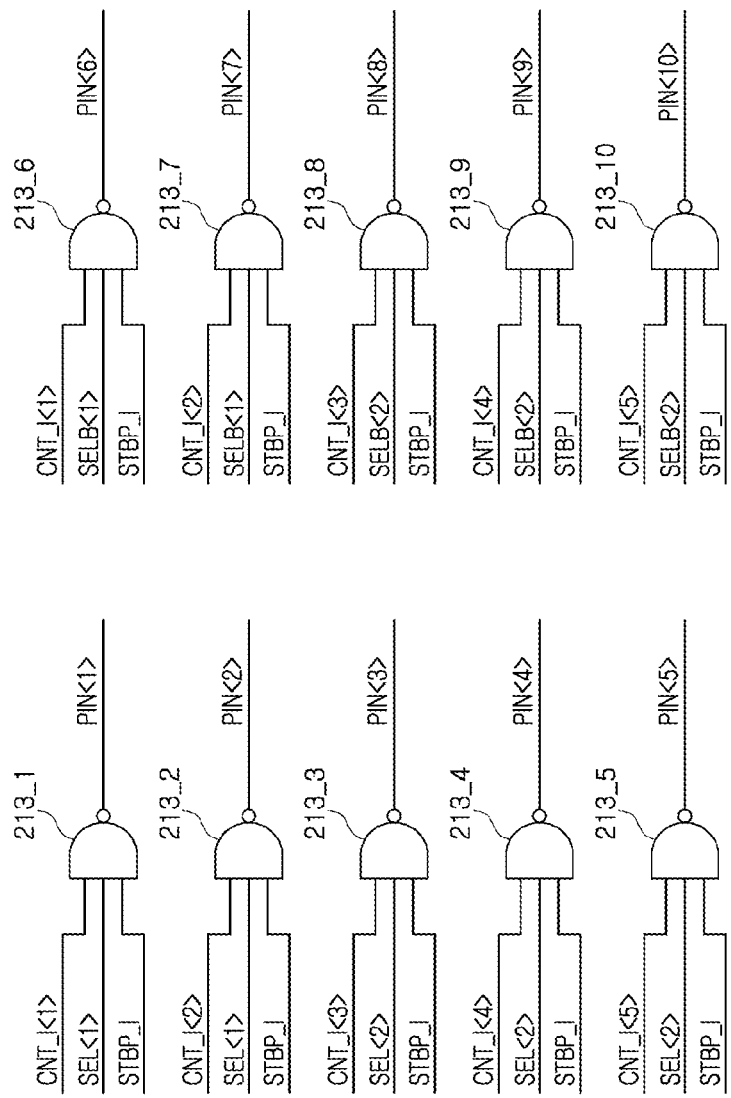
FIG. 4 is a circuit diagram illustrating an example of an input control signal generation circuit included in the input control circuit illustrated in FIG. 1.

FIG. 4 is a circuit diagram illustrating an example of the input control signal generation circuit 213 included in the input control circuit 207 illustrated in FIG. 1. As illustrated in FIG. 4, the input control signal generation circuit 213 may include NAND gates 213_1 to 213_10.

When the first bit CNT_I<1> of the input count signal is activated, the NAND gates 213_1 and 213_6 may output the input strobe pulse STBP_I as the first bit PIN<1> or the sixth bit PIN<6> of the input control signal, according to whether any one of the first bit SEL<1> of the select signal and the first bit SELB<1> of the inverted select signal is activated to a logic high level. The operations of the NAND gates 213_2 and 213_7 are implemented in the same manner as those of the NAND gates 213_1 and 213_6.

When the third bit CNT_I<3> of the input count signal is activated, the NAND gates 213_3 and 213_8 may output the input strobe pulse STBP_I as the third bit PIN<3> or the eighth bit PIN<8> of the input control signal, according to whether any one of the second bit SEL<2> of the select signal and the second bit SELB<2> of the inverted select signal is activated to a logic high level. The operations of the NAND gates 213_4 and 213_9 and the operations of the NAND gates 213_5 and 213_10 are implemented in the same manner as those of the NAND gates 213_3 and 213_8.

Figure 5:
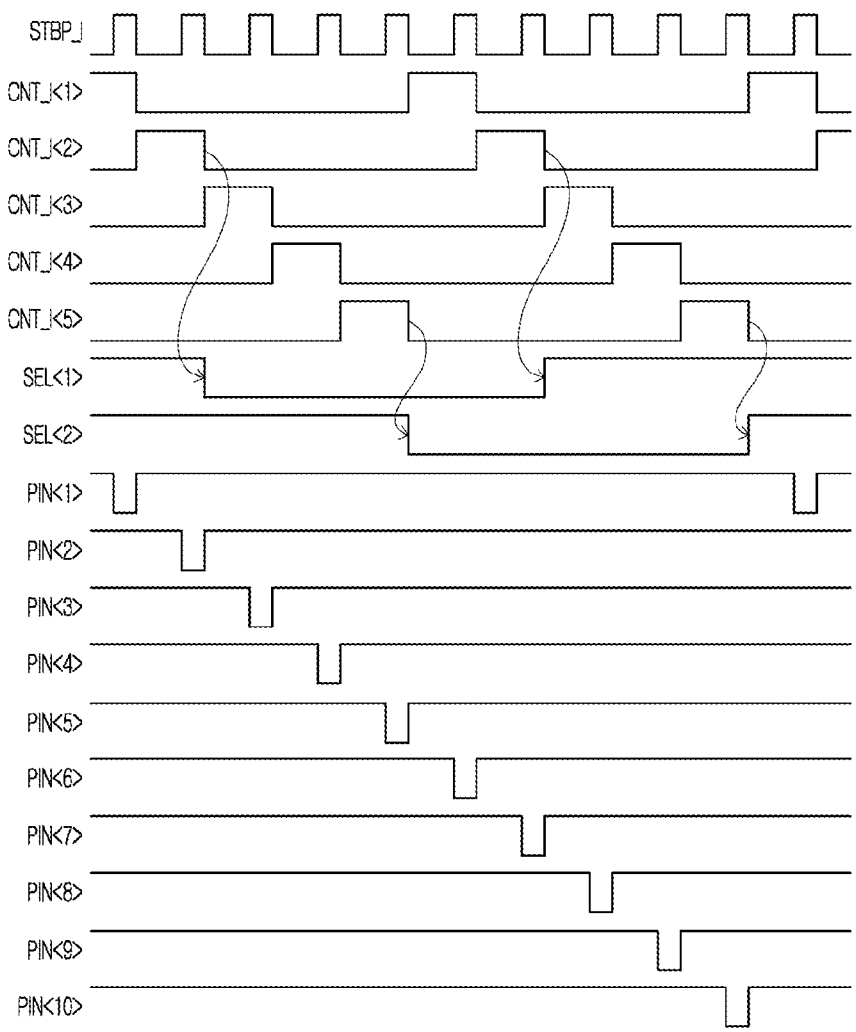
FIG. 5 is a timing diagram for describing an operation of the input control circuit illustrated in FIG. 1.

FIG. 5 is a timing diagram for describing the operation of the input control circuit 207 illustrated in FIG. 1.

During the initialization operation, the input control circuit 207 may set the logic level combination of the first to fifth bits CNT_I<1:5> of the input count signal to 'H, L, L, L, L.' The input control circuit 207 may rotate the logic level combination of the first to fifth bits CNT_I<1:5> of the input count signal in order of 'L, H, L, L, L'; 'L, L, H, L, L'; 'L, L, L, H, L'; 'L, L, L, L, H'; and 'H, L, L, L, L', in synchronization with a falling edge of the input strobe pulse STBP_I after the initialization operation.

The input control circuit 207 may change the logic level of the first bit SEL<1> of the select signal in synchronization with a falling edge of the second bit CNT_I<2> of the input count signal. The input control circuit 207 may change the logic level of the second bit SEL<2> of the select signal in synchronization with a falling edge of the fifth bit CNT_I<5> of the input count signal.

When the input strobe pulses STBP_I are successively inputted, the input control circuit 207 may sequentially activate the first to tenth bits PIN<1:10> of the input control signal according to the logic level combination of the first to fifth bits CNT_I<1:5> of the input count signal and the logic levels of the first and second bits SEL<1:2> of the select signal.

Figure 6:
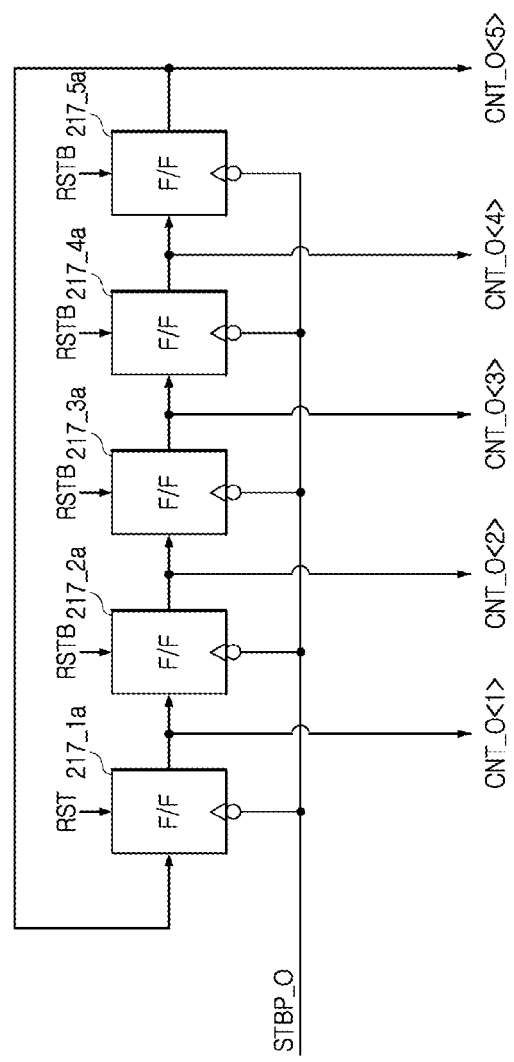
FIG. 6 is a circuit diagram illustrating an example of an output count signal generation circuit included in an output control circuit illustrated in FIG. 1.

FIG. 6 is a circuit diagram illustrating an example of the output count signal generation circuit 217a included in the output control circuit 215a illustrated in FIG. 1. As illustrated in FIG. 6, the output count signal generation circuit 217a may include flip-flops 217_1a to 217_5a. The flip-flops 217_1a to 217_5a may set a logic level combination of the first to fifth bits CNT_O<1:5> of the output count signal to 'H, L, L, L, L,' when the initialization operation is performed on the basis of the reset signal RST and the inverted reset signal RSTB. The flip-flops 217_1a to 217_5a may sequentially change the logic level combination of the first to fifth bits CNT_O<1:5> of the output count signal according to the number of times that the output strobe pulse STBP_O is inputted. For example, when the output strobe pulse STBP_O is inputted for the first time after the initialization operation is performed, the flip-flops 217_1a to 217_5a may set the logic level combination of the first to fifth bits CNT_O<1:5> of the output count signal to 'L, H, L, L, L.' Then, when the output strobe pulse STBP_O is inputted for the second time after the initialization operation is performed, the flip-flops 217_1a to 217_5a may set the logic level combination of the first to fifth bits CNT_O<1:5> of the output count signal to 'L, L, H, L, L.'

Figure 7:
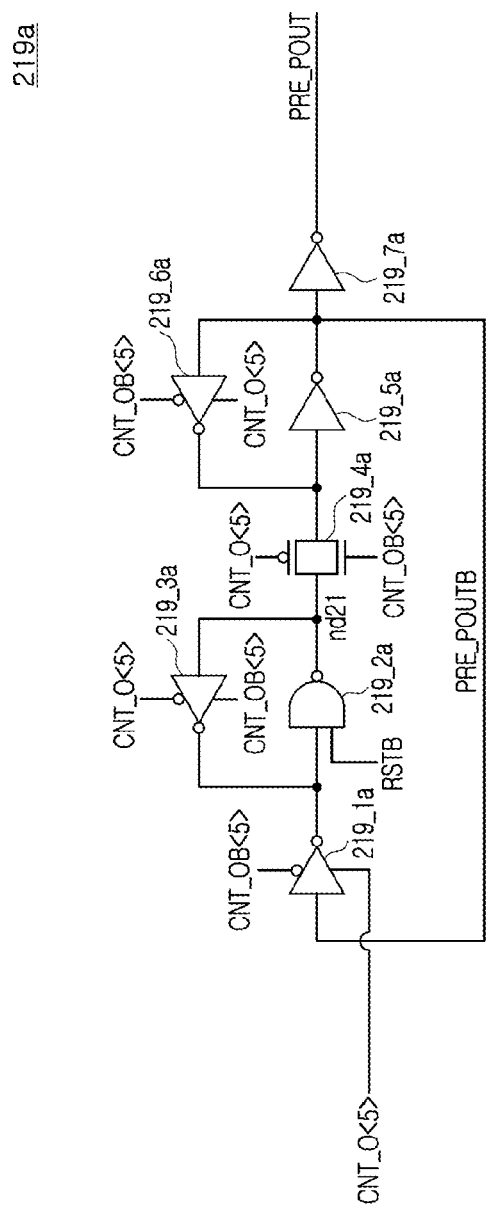
FIG. 7 is a circuit diagram illustrating an example of a pre-output control signal generation circuit included in the output control circuit illustrated in FIG. 1.

FIG. 7 is a circuit diagram illustrating an example of the pre-output control signal generation circuit 219a included in the output control circuit 215a illustrated in FIG. 1. As illustrated in FIG. 7, the pre-output control signal generation circuit 219a may include inverters 219_1a, 219_3a, 219_5a, 219_6a, and 219_7a, a NAND gate 219_2a, and a pass transistor 219_4a. The pre-output control signal generation circuit 219a may change the logic level of the pre-output control signal PRE_POUT in synchronization with a falling edge of the fifth bit CNT_O<5> of the output count signal. Because the operation of the pre-output control signal generation circuit 219a to change the logic level of the pre-output control signal PRE_POUT is implemented in the same manner as the operation of the first select signal generation circuit (231 of FIG. 3) to change the logic level of the first bit SEL<1> of the select signal, the detailed descriptions thereof will be omitted herein.

Figure 8:
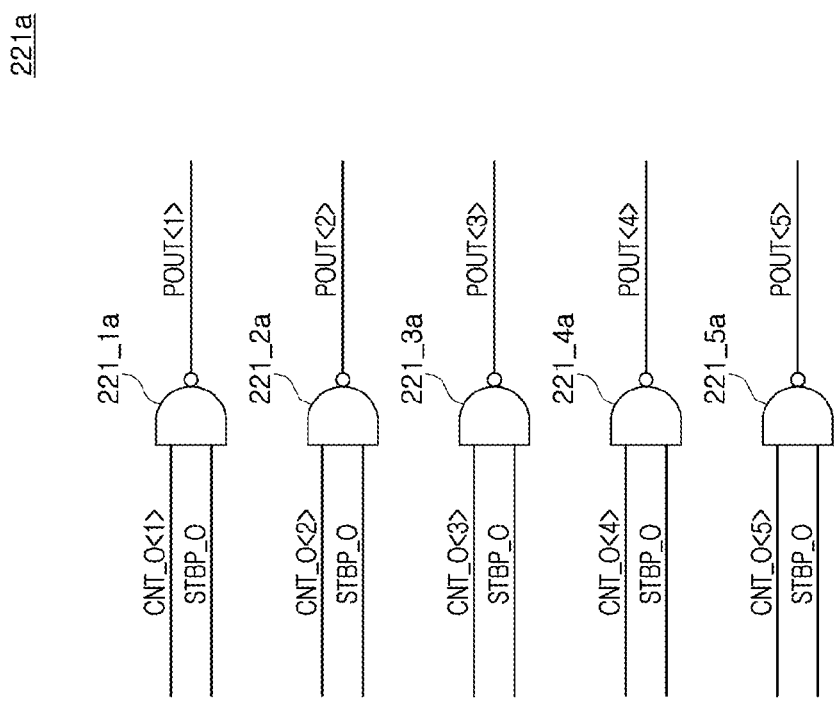
FIG. 8 is a circuit diagram illustrating an example of an output control signal generation circuit included in the output control circuit illustrated in FIG. 1.

FIG. 8 is a circuit diagram illustrating an example of the output control signal generation circuit 221a included in the output control circuit 215a illustrated in FIG. 1. As illustrated in FIG. 8, the output control signal generation circuit 221a may include NAND gates 221_1a to 221_5a. When the first bit CNT_O<1> of the output count signal is activated, the NAND gate 221_1a may invert and buffer the output strobe pulse STBP_O, and output the inverted and buffered pulse as the first bit POUT<1> of the output control signal. The operations of the NAND gates 221_2a to 221_5a are implemented in the same manner as that of the NAND gate 221_1a.

Figure 9:
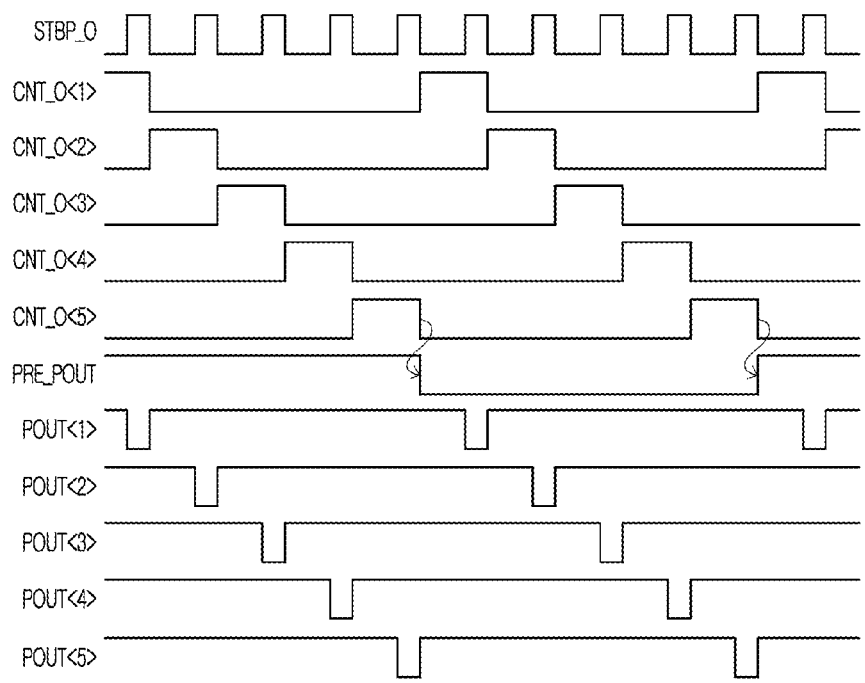
FIG. 9 is a timing diagram for describing an operation of the output control circuit illustrated in FIG. 1.

FIG. 9 is a timing diagram for describing the operation of the output control circuit 215a illustrated in FIG. 1.

During the initialization operation, the output control circuit 215a may set the logic level combination of the first to fifth bits CNT_O<1:5> of the output count signal to 'H, L, L, L, L.' The output control circuit 215a may rotate the logic level combination of the first to fifth bits CNT_O<1:5> of the output count signal in order 'L, H, L, L, L'; 'L, L, H, L'; 'L, L, L, H, L'; 'L, L, L, L, H'; and 'H, L, L, L, L', in synchronization with a falling edge of the output strobe pulse STBP_O after the initialization operation.

The output control circuit 215a may change the logic level of the pre-output control signal PRE_POUT in synchronization with a falling edge of the fifth bit CNT_O<5> of the output count signal.

When the output strobe pulses STBP_O are successively inputted, the output control circuit 215a may sequentially activate the first to fifth bits POUT<1:5> of the output control signal according to the logic level combination of the first to fifth bits CNT_O<1:5> of the output count signal.

Figure 10:
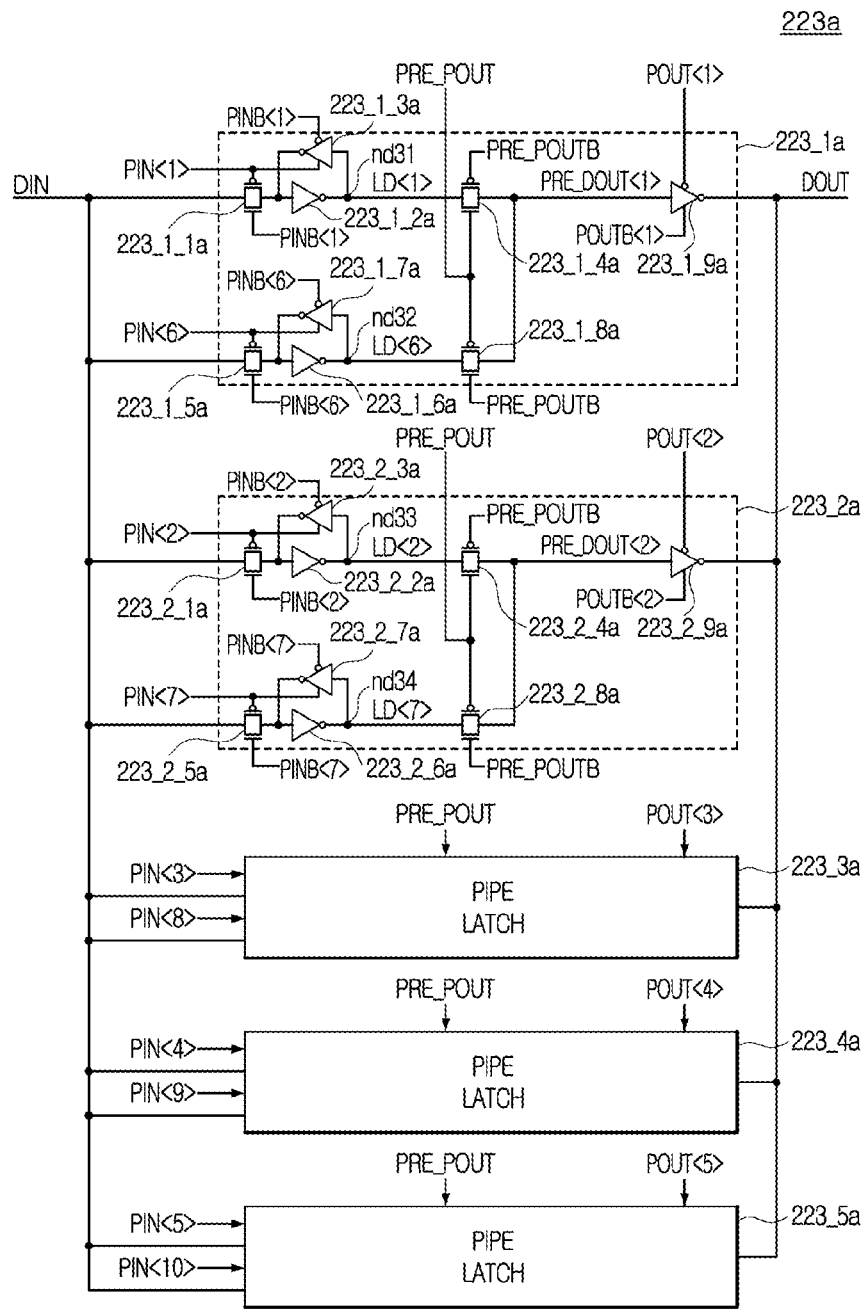
FIG. 10 is a diagram illustrating an example of a pipe circuit illustrated in FIG. 1.

FIG. 10 is a diagram illustrating an example of the pipe circuit 223a illustrated in FIG. 1. As illustrated in FIG. 10, the pipe circuit 223a may include the first pipe latch circuit 223_1a, a second pipe latch circuit 223_2a, a third pipe latch circuit 223_3a, a fourth pipe latch circuit 223_4a, and a fifth pipe latch circuit 223_5a.

The first pipe latch circuit 223_1a may latch the input data DIN and output the latched data as the output data DOUT, on the basis of the first bit PIN<1> of the input control signal, the sixth bit PIN<6> of the input control signal, the pre-output control signal PRE_POUT, and the first bit POUT<1> of the output control signal. The first pipe latch circuit 223_1a may generate a first bit LD<1> of the latched data by latching the input data DIN in a node nd31, when the first bit PIN<1> of the input control signal is activated. The first pipe latch circuit 223_1a may generate a sixth bit LD<6> of the latched data by latching the input data DIN in a node nd32, when the sixth bit PIN<6> of the input control signal is activated. The first pipe latch circuit 223_1a may set one of the first bit LD<1> and the sixth bit LD<6> of the latched data to a first bit PRE_DOUT<1> of the pre-output data, according to the logic level of the pre-output control signal PRE_POUT. For example, the first pipe latch circuit 223_1a may set the first bit LD<1> of the latched data to the first bit PRE_DOUT<1> of the pre-output data when the pre-output control signal PRE_POUT has a logic high level, and set the sixth bit LD<6> of the latch data to the first bit PRE_DOUT<1> of the pre-output data when the pre-output control signal PRE_POUT has a logic low level. When the first bit POUT<1> of the output control signal is activated, the first pipe latch circuit 223_1a may output the first bit PRE_DOUT<1> of the pre-output data as the output data DOUT. The first pipe latch circuit 223_1a may include pass transistors 223_1_1a, 223_1_4a, 223_1_5a, and 223_1_8a and inverters 223_1_2a, 223_1_3a, 223_1_6a, 223_1_7a, and 223_1_9a.

The second pipe latch circuit 223_2a may latch the input data DIN and output the latched data as the output data DOUT, on the basis of the second bit PIN<2> of the input control signal, the seventh bit PIN<7> of the input control signal, the pre-output control signal PRE_POUT, and the second bit POUT<2> of the output control signal. The second pipe latch circuit 223_2a may generate a second bit LD<2> of the latched data by latching the input data DIN in a node nd33, when the second bit PIN<2> of the input control signal is activated. The second pipe latch circuit 223_2a may generate a seventh bit LD<7> of the latched data by latching the input data DIN in a node nd34, when the seventh bit PIN<7> of the input control signal is activated. The second pipe latch circuit 223_2a may set one of the second bit LD<2> and the seventh bit LD<7> of the latched data to a second bit PRE_DOUT<2> of the pre-output data, according to the logic level of the pre-output control signal PRE_POUT. When the second bit POUT<2> of the output control signal is activated, the second pipe latch circuit 223_2a may output the second bit PRE_DOUT<2> of the pre-output data as the output data DOUT. The second pipe latch circuit 223_2a may include pass transistors 223_2_1a, 223_2_4a, 223_2_5a, and 223_2_8a and inverters 223_2_2a, 223_2_3a, 223_2_6a, 223_2_7a, and 223_2_9a. The configurations and operations of the third pipe latch circuit 223_3a, the fourth pipe latch circuit 223_4a, and the fifth pipe latch circuit 223_5a are implemented in the same manner as those of the first pipe latch circuit 223_1a and the second pipe latch circuit 223_2a.

Figure 11:
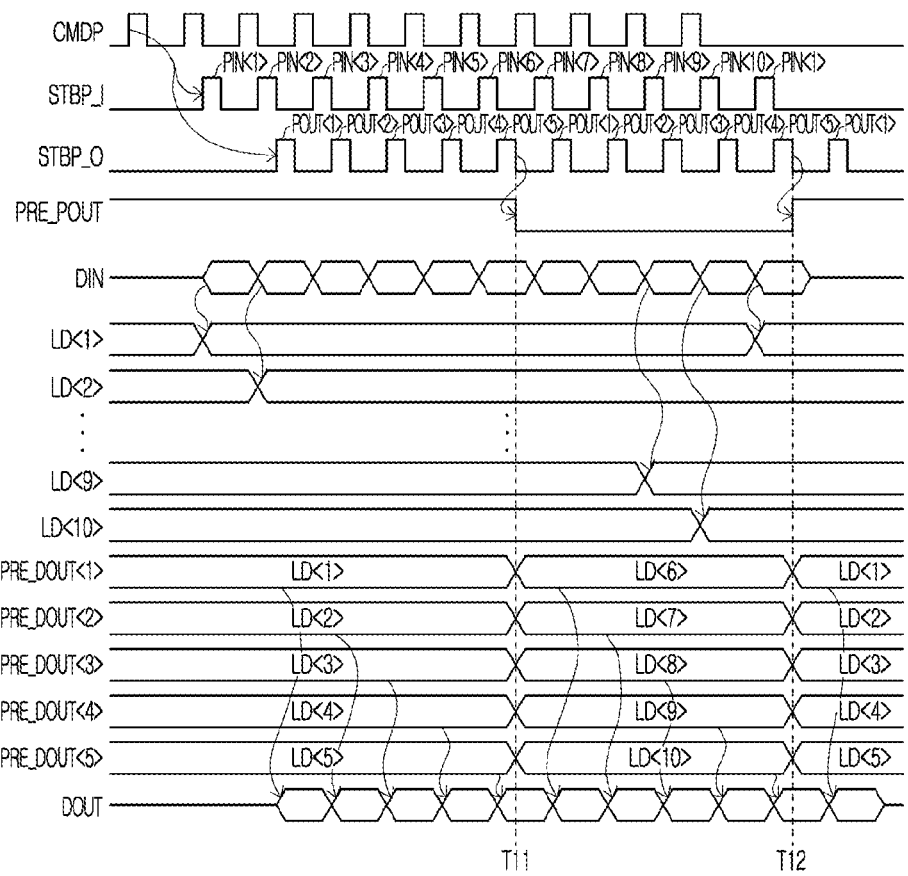
FIG. 11 is a timing diagram for describing an operation of the semiconductor device illustrated in FIG. 1.

FIG. 11 is a timing diagram for describing an operation of the semiconductor device 100a illustrated in FIG. 1. As illustrated in FIG. 11, the semiconductor device 100a may generate a command pulse CMDP whenever a command (not illustrated) is applied.

The input strobe pulse generation circuit 201 may generate the input strobe pulse STBP_I from the command pulse CMDP. The data storage circuit 205 may output the input data DIN stored in the cell array in synchronization with the input strobe pulse STBP_I. The input control circuit 207 may sequentially activate the first to tenth bits PIN<1:10> of the input control signal according to the number of times that the input strobe pulse STBP_I is inputted.

The output strobe pulse generation circuit 203 may generate the output strobe pulse STBP_O by delaying the command pulse CMDP by read latency. The output control circuit 215a may sequentially activate the first to fifth bits POUT<1:5> of the output control signal according to the number of times that the output strobe pulse STBP_O is inputted. The output control circuit 215a may change the logic level of the pre-output control signal PRE_POUT in synchronization with the fifth bit POUT<5> of the output control signal, at times T11 and T12.

When the first to tenth bits PIN<1:10> of the input control signal are sequentially activated, the pipe circuit 223a may sequentially generate the first to tenth bits LD<1:10> of the latched data by latching the input data DIN.

When the pre-output control signal PRE_POUT has a logic high level, the pipe circuit 223a may set the first to fifth bits LD<1:5> of the latched data to the first to fifth bits PRE_DOUT<1:5> of the pre-output data, respectively.

When the pre-output control signal PRE_POUT has a logic low level, the pipe circuit 223a may set the sixth to tenth bits LD<6:10> of the latched data to the first to fifth bits PRE_DOUT<1:5> of the pre-output data, respectively, at time T11.

When the pre-output control signal PRE_POUT has a logic high level, the pipe circuit 223a may re-set the first to fifth bits LD<1:5> of the latched data to the first to fifth bits PRE_DOUT<1:5> of the pre-output data, respectively, at time T12.

When the first to fifth bits POUT<1:5> of the output control signal are sequentially activated, the pipe circuit 223a may sequentially output the output data DOUT from the first to fifth bits PRE_DOUT<1:5> of the pre-output data.

Figure 12:
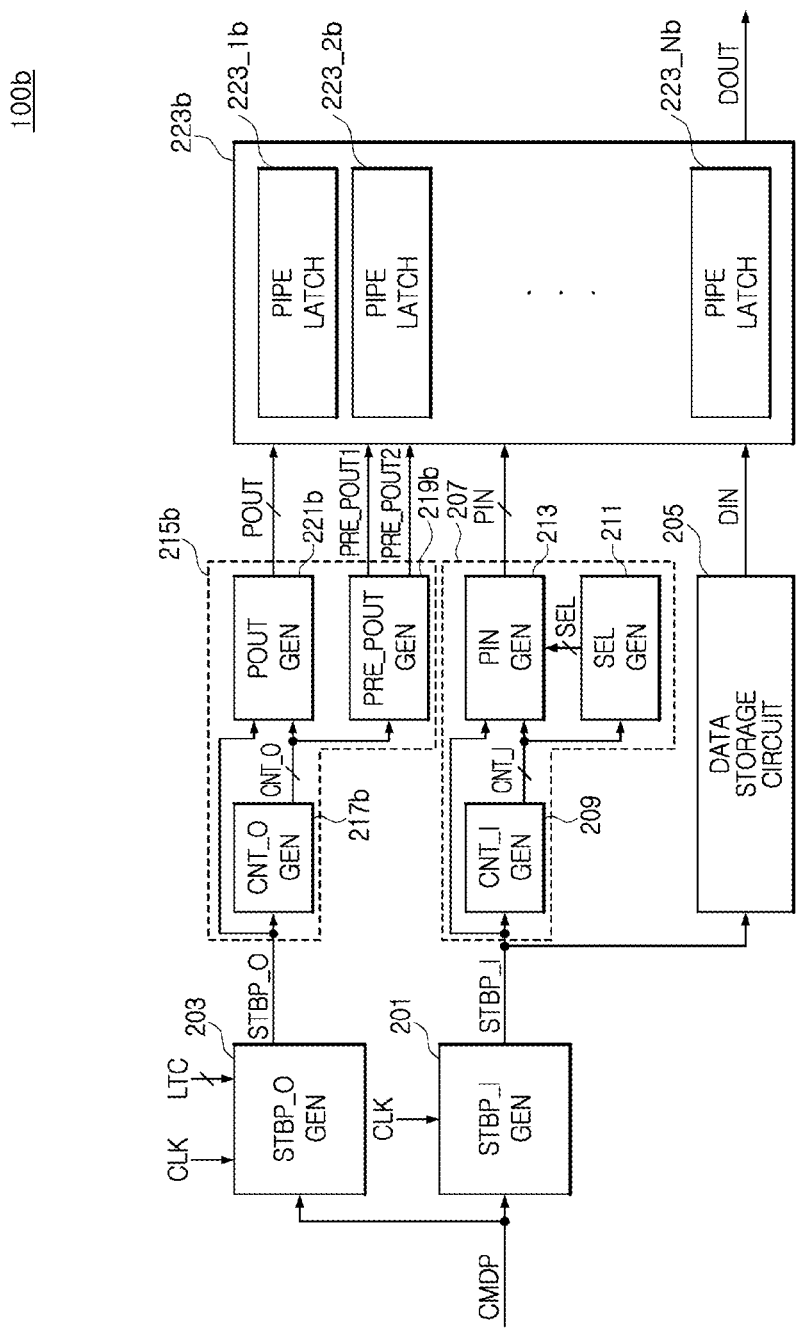
FIG. 12 is a block diagram illustrating a configuration of a semiconductor device in accordance with another embodiment.

FIG. 12 is a block diagram illustrating a configuration of a semiconductor device 100b in accordance with another embodiment. As illustrated in FIG. 12, the semiconductor device 100b may include an input strobe pulse generation circuit (STBP_I GEN) 201, an output strobe pulse generation circuit (STBP_O GEN) 203, a data storage circuit 205, an input control circuit 207, an output control circuit 215b, and a pipe circuit 223b.

The input strobe pulse generation circuit 201 may generate an input strobe pulse STBP_I from a command pulse CMDP in synchronization with a clock CLK. The input strobe pulse generation circuit 201 may generate the input strobe pulse STBP_I from the command pulse CMDP whenever a read operation is performed.

The output strobe pulse generation circuit 203 may generate an output strobe pulse STBP_O by delaying the command pulse CMDP by read latency on the basis of a latency signal LTC in synchronization with the clock CLK. The output strobe pulse generation circuit 203 may generate the output strobe pulse STBP_O by delaying the command pulse CMDP by the read latency, whenever a read operation is performed.

The data storage circuit 205 may include a plurality of cell arrays (not illustrated) configured to store input data DIN. The data storage circuit 205 may output the input data DIN stored in the cell arrays in synchronization with the input strobe pulse STBP_I.

The input control circuit 207 may include an input count signal generation circuit (CNT_I GEN) 209, a select signal generation circuit (SEL GEN) 211, and an input control signal generation circuit (PIN GEN) 213. The input control circuit 207 may sequentially activate the bits of the input control signal PIN according to the number of times that the input strobe pulse STBP_I is inputted. The input control signal PIN may include first to $2N^{th}$ bits.

The output control circuit 215b may include an output count signal generation circuit (CNT_O GEN) 217b, a pre-output control signal generation circuit (PRE_POUT GEN) 219b, and an output control signal generation circuit (POUT GEN) 221b. The output control circuit 215b may sequentially activate the bits of the output control signal POUT according to the number of times that the output strobe pulse STBP_O is inputted. The output count signal POUT may include first to $N^{th}$ bits. The output control circuit 215b may change the logic levels of first and second pre-output control signals PRE_POUT1 and PRE_POUT2 in synchronization with a preset bit among the bits of the output control signal POUT. In the present embodiment, the preset bit of the output control signal POUT may be set as a plurality of bits. For example, the output control circuit 215b may change the logic level of the first pre-output control signal PRE_POUT1 in synchronization with the third bit POUT<3> of the output control signal, and change the logic level of the second pre-output control signal PRE_POUT2 in synchronization with the first bit POUT<1> of the output control signal.

The output count signal generation circuit 217b may sequentially activate the bits of the output count signal CNT_O by counting the number of times that the output strobe pulse STBP_O is inputted. The output count signal CNT_O may include first to $N^{th}$ bits. The configuration and operation of the output count signal generation circuit 217b are implemented in the same manner as those of the output count signal generation circuit 217a illustrated in FIG. 1.

The pre-output control signal generation circuit 219b may change the logic levels of the first and second pre-output control signals PRE_POUT1 and PRE_POUT2 in synchronization with preset bits among the bits of the output count signal CNT_O. For example, the pre-output control signal generation circuit 219b may change the logic level of the first pre-output control signal PRE_POUT1 in synchronization with the third bit CNT_O<3> of the output count signal, and change the logic level of the second pre-output control signal PRE_POUT2 in synchronization with the first bit CNT_O<1> of the output count signal. The configuration and operation of the pre-output control signal generation circuit 219a will be described below in detail with reference to FIG. 13.

The output control signal generation circuit 221b may output the output strobe pulse STBP_O as one of the bits of the output control signal POUT according to the logic level combination of the output count signal CNT_O. The configuration and operation of the output control signal generation circuit 221b are implemented in the same manner as those of the output control signal generation circuit 221a illustrated in FIG. 1.

The pipe circuit 223b may include a plurality of pipe latch circuits 223_1b to 223_Nb. The pipe circuit 223b may generate latched data (not illustrated) by latching the input data DIN on the basis of the input control signal PIN, may select some bits of the bits of the latched data and set the selected bits as pre-output data (not illustrated) on the basis of the first pre-output control signal PRE_POUT1 and the second pre-output control signal PRE_POUT2, and may output the pre-output data as output data DOUT on the basis of the output control signal POUT.

The pipe circuit 223b may generate first to $2N^{th}$ bits of the latched data by latching the input data DIN on the basis of the first to $2N^{th}$ bits PIN<1:2N> of the input control signal.

The pipe circuit 223b may select some bits of the bits of the latched data according to the logic levels of the first and second pre-output control signals PRE_POUT1 and PRE_POUT2, and may set the selected bits to the bits of the pre-output data. For example, the pipe circuit 223b may set the first and second bits of the latched data to first and second bits of the pre-output data or set the sixth and seventh bits of the latched data to the first and second bits of the pre-output data, according to the logic level of the first pre-output control signal PRE_POUT1. The pipe circuit 223b may set the third to fifth bits of the latched data to third to fifth bits of the pre-output data or set the eighth to tenth bits of the latched data to the third to fifth bits of the pre-output data, according to the logic level of the second pre-output control signal PRE_POUT2. Thus, the pipe circuit 223b may set, to the pre-output data, only some bits which are selected according to the number of times that the output data DOUT is outputted, among the bits of the latched data, on the basis of the first and second pre-output control signals PRE_POUT1 and PRE_POUT2, thereby reducing the loading of a node from which the output data DOUT is outputted.

The pipe circuit 223b may output the first to $N^{th}$ bits of the pre-output data as the output data DOUT on the basis of the first to $N^{th}$ bits POUT<1:N> of the output control signal. The configuration and operation of the pipe circuit 223b will be described below in detail with reference to FIG. 15.

Figure 13:
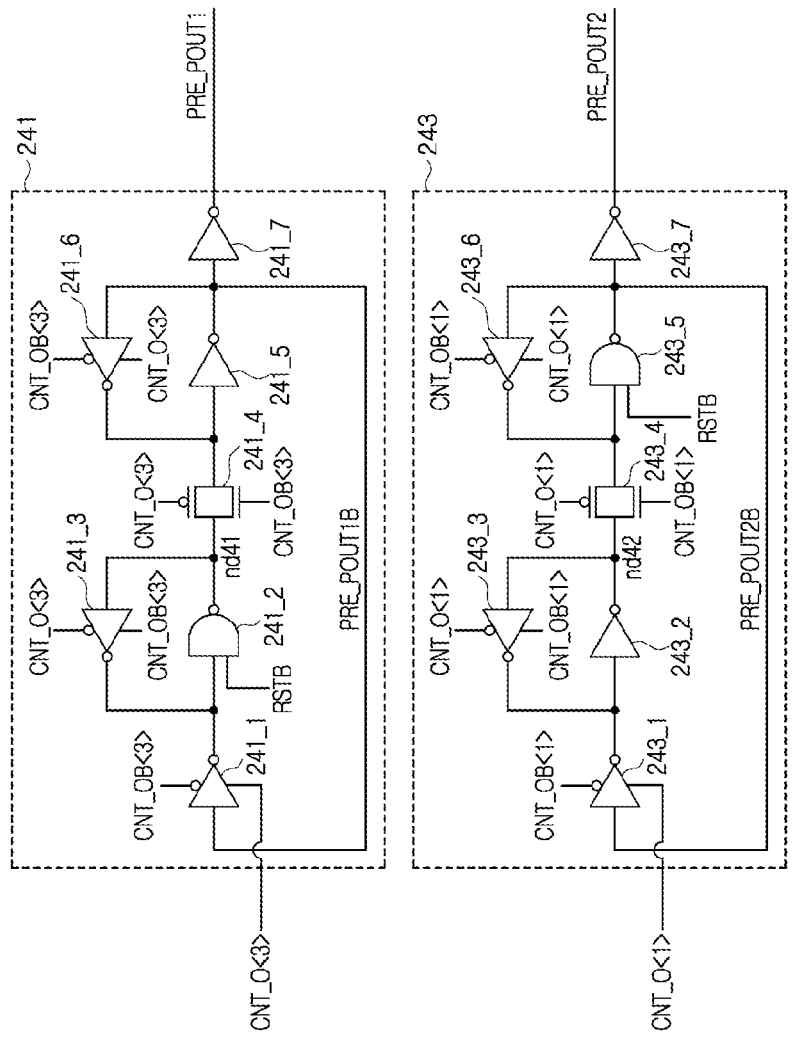
FIG. 13 is a circuit diagram illustrating an example of a pre-output control signal generation circuit included in an output control circuit illustrated in FIG. 12.

FIG. 13 is a circuit diagram illustrating an example of the pre-output control signal generation circuit 219b included in the output control circuit 215b illustrated in FIG. 12. As illustrated in FIG. 13, the pre-output control signal generation circuit 219b may include a first pre-output control signal generation circuit 241 and a second pre-output control signal generation circuit 243.

The first pre-output control signal generation circuit 241 may include inverters 241_1, 241_3, 241_5, 241_6, and 241_7, a NAND gate 241_2, and a pass transistor 241_4. The first pre-output control signal generation circuit 241 may change the logic level of the first pre-output control signal PRE_POUT1 in synchronization with a falling edge of the third bit CNT_O<3> of the output count signal. The first pre-output control signal generation circuit 241 may set the first pre-output control signal PRE_POUT1 to a logic high level on the basis of an inverted reset signal RSTB which has a logic low level during an initialization operation. Because the operation of the first pre-output control signal generation circuit 241 to change the logic level of the first pre-output control signal PRE_POUT1 is implemented in the same manner as the operation of the first select signal generation circuit (231 of FIG. 3) to change the logic level of the first bit SEL<1> of the select signal, the detailed descriptions thereof will be omitted herein.

The second pre-output control signal generation circuit 243 may include inverters 243_1, 243_2, 243_3, 243_6, and 243_7, a pass transistor 243_4, and a NAND gate 243_5. The second pre-output control signal generation circuit 243 may change the logic level of the second pre-output control signal PRE_POUT2 in synchronization with a falling edge of the first bit CNT_O<1> of the output count signal. The second pre-output control signal generation circuit 243 may set the second pre-output control signal PRE_POUT2 to a logic low level on the basis of the inverted reset signal RSTB which has a logic low level during the initialization operation. Because the operation of the second pre-output control signal generation circuit 243 to change the logic level of the second pre-output control signal PRE_POUT2 is implemented in the same manner as the operation of the first select signal generation circuit (231 of FIG. 3) to change the logic level of the first bit SEL<1> of the select signal, the detailed descriptions thereof will be omitted herein.

Figure 14:
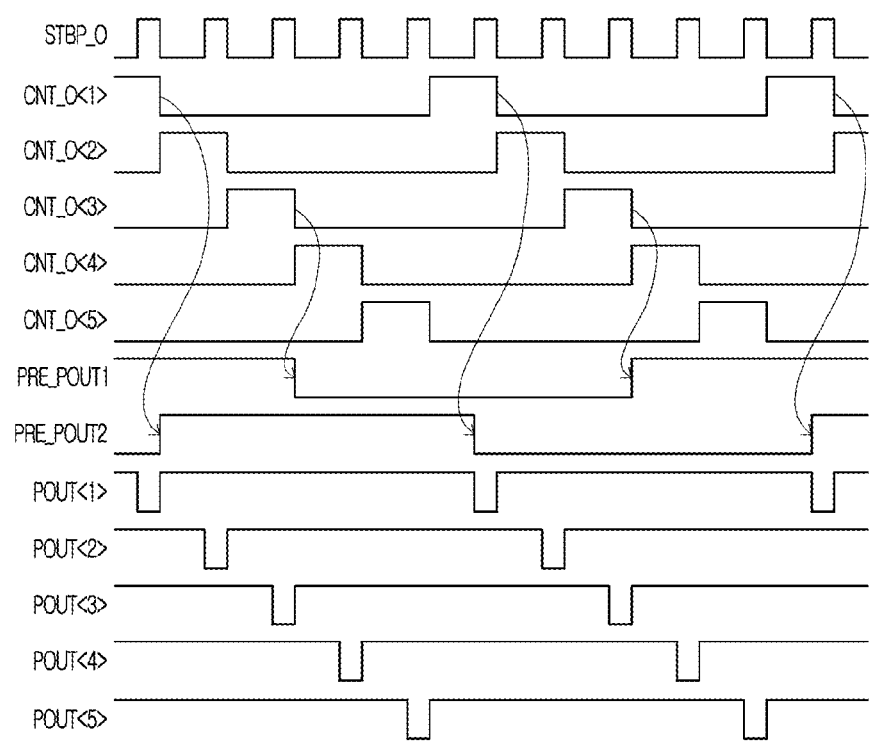
FIG. 14 is a timing diagram for describing an operation of the output control circuit illustrated in FIG. 12.

FIG. 14 is a timing diagram for describing the operation of the output control circuit 215b illustrated in FIG. 12.

During the initialization operation, the output control circuit 215b may set a logic level combination of the first to fifth bits CNT_O<1:5> of the output count signal to 'H, L, L, L, L.' The output control circuit 215b may rotate the logic level combination of the first to fifth bits CNT_O<1:5> of the output count signal in order 'L, H, L, L, L'; 'L, L, H, L, L'; 'L, L, L, H, L'; 'L, L, L, L, H'; and 'H, L, L, L, L', in synchronization with a falling edge of the output strobe pulse STBP_O after the initialization operation.

The output control circuit 215b may change the logic level of the first pre-output control signal PRE_POUT1 in synchronization with a falling edge of the third bit CNT_O<3> of the output count signal.

The output control circuit 215b may change the logic level of the second pre-output control signal PRE_POUT2 in synchronization with a falling edge of the first bit CNT_O<1> of the output count signal.

When the output strobe pulses STBP_O are successively inputted, the output control circuit 215a may sequentially activate the first to fifth bits POUT<1:5> of the output control signal according to the logic level combination of the first to fifth bits CNT_O<1:5> of the output count signal.

Figure 15:
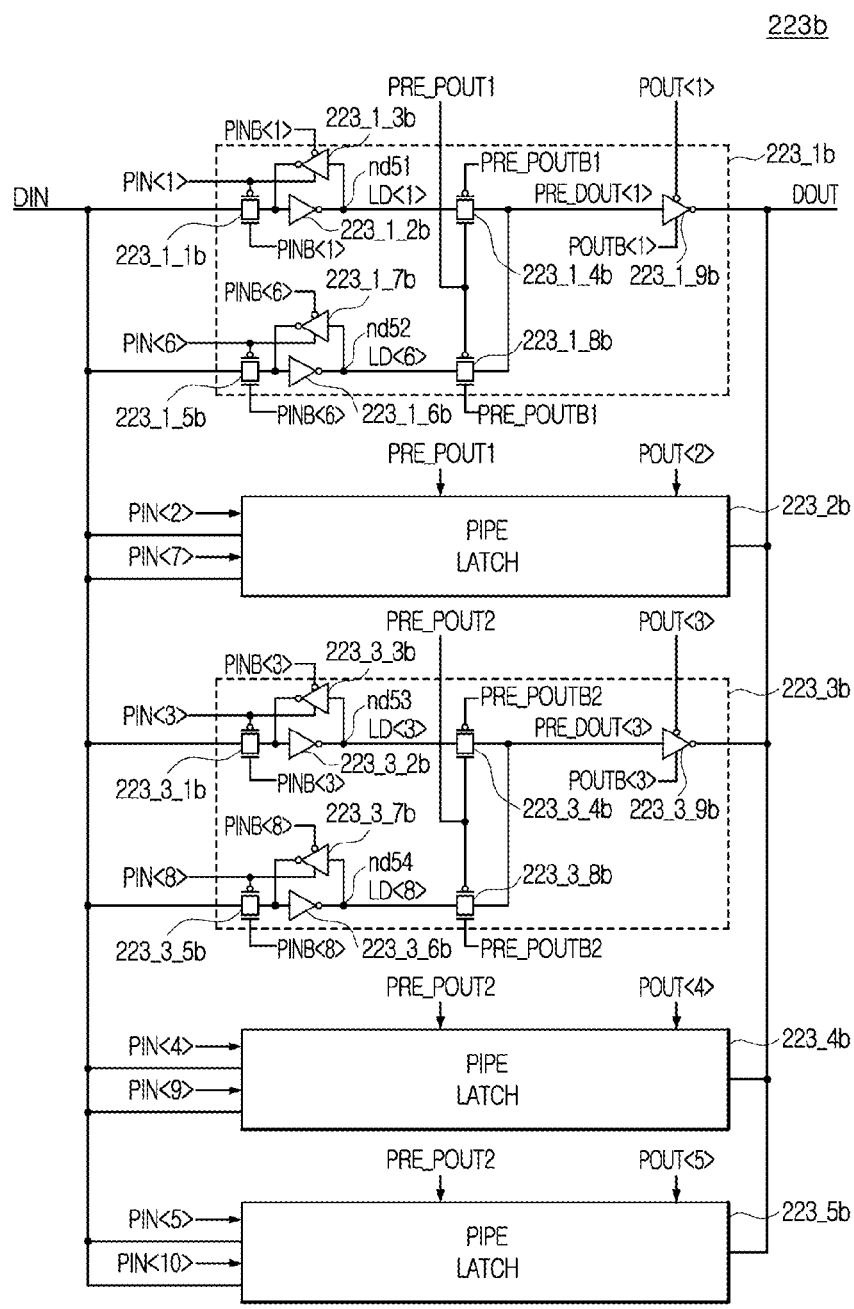
FIG. 15 is a diagram illustrating an example of a pipe circuit illustrated in FIG. 12.

FIG. 15 is a diagram illustrating an example of the pipe circuit 223b illustrated in FIG. 12. As illustrated in FIG. 15, the pipe circuit 223b may include a first pipe latch circuit 223_1b, a second pipe latch circuit 223_2b, a third pipe latch circuit 223_3b, a fourth pipe latch circuit 223_4b, and a fifth pipe latch circuit 223_5b.

The first pipe latch circuit 223_1b may include pass transistors 223_1_1b, 223_1_4b, 223_1_5b, and 223_1_8b and inverters 223_1_2b, 223_1_3b, 223_1_6b, 223_1_7b, and 223_1_9b. The first pipe latch circuit 223_1b may generate a first bit LD<1> of the latched data by latching the input data DIN in a node nd51, when the first bit PIN<1> of the input control signal is activated. The first pipe latch circuit 223_1b may generate a sixth bit LD<6> of the latched data by latching the input data DIN in a node nd52, when the sixth bit PIN<6> of the input control signal is activated. The first pipe latch circuit 223_1b may set one of the first bit LD<1> and the sixth bit LD<6> of the latched data to a first bit PRE_DOUT<1> of the pre-output data, according to the logic level of the first pre-output control signal PRE_POUT1. When the first bit POUT<1> of the output control signal is activated, the first pipe latch circuit 223_1b may output the first bit PRE_DOUT<1> of the pre-output data as the output data DOUT. The configuration and operation of the second pipe latch circuit 223_2b are implemented in the same manner as those of the first pipe latch circuit 223_1b.

The third pipe latch circuit 223_3b may include pass transistors 223_3_1b, 223_3_4b, 223_3_5b, and 223_3_8b and inverters 223_3_2b, 223_3_3b, 223_3_6b, 223_3_7b, and 223_3_9b. The third pipe latch circuit 223_3b may generate a third bit LD<3> of the latched data by latching the input data DIN in a node nd53, when the third bit PIN<3> of the input control signal is activated. The third pipe latch circuit 223_3b may generate an eighth bit LD<8> of the latched data by latching the input data DIN in a node nd54, when the eighth bit PIN<8> of the input control signal is activated. The third pipe latch circuit 223_3b may set one of the third bit LD<3> and the eighth bit LD<8> of the latched data to a third bit PRE_DOUT<3> of the pre-output data, according to the logic level of the second pre-output control signal PRE_POUT2. When the third bit POUT<3> of the output control signal is activated, the third pipe latch circuit 223_3b may output the third bit PRE_DOUT<3> of the pre-output data as the output data DOUT. The configurations and operations of the fourth and fifth pipe latch circuits 223_4b and 223_5b are implemented in the same manner as those of the third pipe latch circuit 223_3b.

Figure 16:
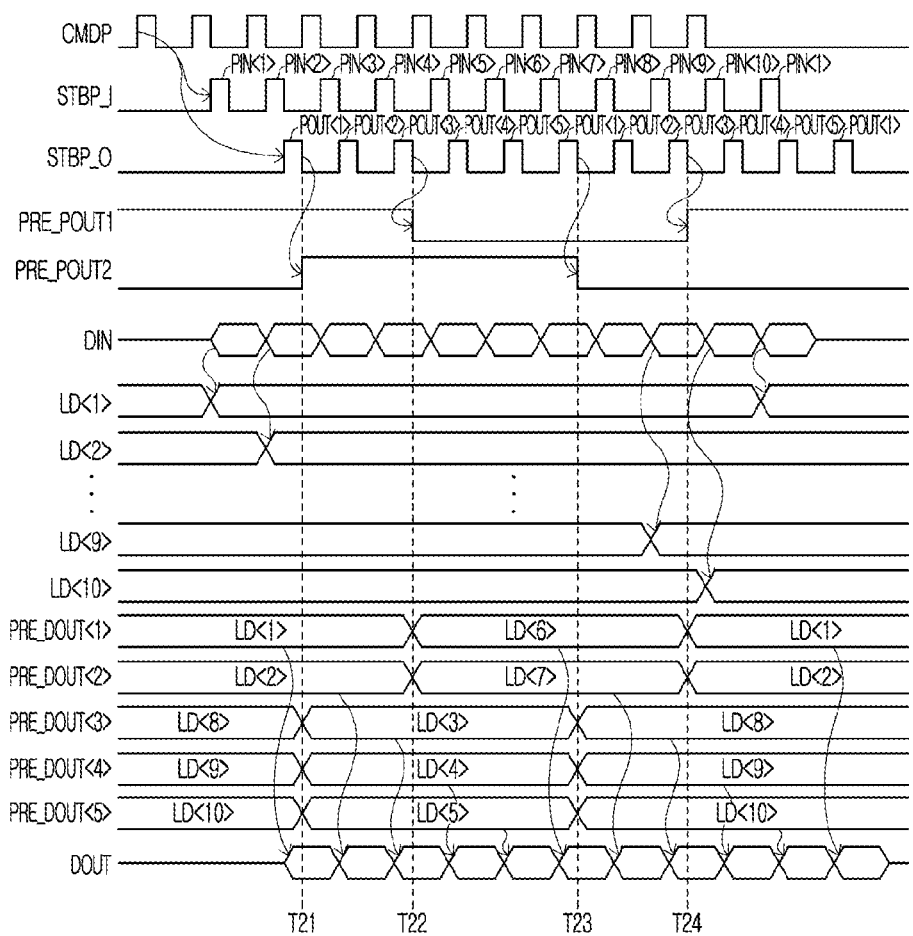
FIG. 16 is a timing diagram for describing an operation of the semiconductor device illustrated in FIG. 12.

FIG. 16 is a timing diagram for describing an operation of the semiconductor device 100b illustrated in FIG. 12. The semiconductor device 100b may generate the command pulse CMDP whenever a command (not illustrated) is applied.

The input strobe pulse generation circuit 201 may generate the input strobe pulse STBP_I from the command pulse CMDP. The data storage circuit 205 may output the input data DIN stored in the cell arrays in synchronization with the input strobe pulse STBP_I. The input control circuit 207 may sequentially activate the first to tenth bits PIN<1:10> of the input control signal according to the number of times that the input strobe pulse STBP_I is inputted.

The output strobe pulse generation circuit 203 may generate the output strobe pulse STBP_O by delaying the command pulse CMDP by read latency. The output control circuit 215b may sequentially activate the first to fifth bits POUT<1:5> of the output control signal according to the number of times that the output strobe pulse STBP_O is inputted. The output control circuit 215b may change the logic level of the first pre-output control signal PRE_POUT1 in synchronization with the third bit POUT<3> of the output control signal, at times T21 and T23. The output control circuit 215b may change the logic level of the second pre-output control signal PRE_POUT2 in synchronization with the first bit POUT<1> of the output control signal, at times T22 and T24.

When the first to tenth bits PIN<1:10> of the input control signal are sequentially activated, the pipe circuit 223b may sequentially generate the first to tenth bits LD<1:10> of the latched data by latching the input data DIN.

When the first pre-output control signal PRE_POUT1 has a logic high level, the pipe circuit 223b may set the first and second bits LD<1:2> of the latched data to the first and second bits PRE_DOUT<1:2> of the pre-output data, respectively. When the second pre-output control signal PRE_POUT2 has a logic low level, the pipe circuit 223b may set the eighth to tenth bits LD<8:10> of the latched data to the third to fifth bits PRE_DOUT<3:5> of the pre-output data, respectively.

When the second pre-output control signal PRE_POUT2 has a logic high level, the pipe circuit 223b may set the third to fifth bits LD<3:5> of the latched data to the third to fifth bits PRE_DOUT<3:5> of the pre-output data, respectively, at time T21.

When the first pre-output control signal PRE_POUT1 has a logic low level, the pipe circuit 223b may set the sixth and seventh bits LD<6:7> of the latched data to the first and second bits PRE_DOUT<1:2> of the pre-output data, respectively, at time T22.

When the second pre-output control signal PRE_POUT2 has a logic low level, the pipe circuit 223b may re-set the eighth to tenth bits LD<8:10> of the latched data to the third to fifth bits PRE_DOUT<3:5> of the pre-output data, respectively, at time T23.

When the first pre-output control signal PRE_POUT1 has a logic high level, the pipe circuit 223b may re-set the first and second bits LD<1:2> of the latched data to the first and second bits PRE_DOUT<1:2> of the pre-output data, respectively, at time T24.

When the first to fifth bits POUT<1:5> of the output control signal are sequentially activated, the pipe circuit 223b may sequentially output the output data DOUT from the first to fifth bits PRE_DOUT<1:5> of the pre-output data.

As described above, a semiconductor device in accordance with the present disclosure may set, to the pre-output data, only some bits which are selected according to the number of times that the output data is outputted, among the bits of data latched in the pipe circuit, and output the pre-output data as the output data in synchronization with output timings, when outputting the latched data as the output data, thereby reducing the loading of the node to which the output data is outputted from the pipe circuit.

Although some embodiments of the present teachings have been disclosed for illustrative purposes, those skilled in the art will appreciate that various modifications, additions, and substitutions are possible, without departing from the scope and spirit of the present teachings as defined in the accompanying claims.

What is claimed is:

1. A semiconductor device comprising:
an output control circuit configured to generate a pre-output control signal and an output control signal according to the number of times that an output strobe pulse is inputted; and
a pipe circuit configured to:
generate latched data by latching input data on the basis of an input control signal,
select some bits of the bits of the latched data and set the selected bits to pre-output data, on the basis of the pre-output control signal, and
output the pre-output data as output data on the basis of the output control signal.

2. The semiconductor device of claim 1, wherein the pipe circuit is configured to:
generate a $K^{th}$ bit of the latched data by latching the input data when a $K^{th}$ bit of the input control signal is activated, and
generate an $(N+K)^{th}$ bit of the latched data by latching the input data when an $(N+K)^{th}$ bit of the input control signal is activated,
wherein 'K' is a natural number equal to or less than N, and 'N' is set to a natural number equal to or greater than 2.

3. The semiconductor device of claim 2, further comprising an input control circuit configured to sequentially activate the bits of the input control signal according to the number of times that an input strobe pulse is inputted,
wherein the input control signal comprises first to $2N^{th}$ bits.

4. The semiconductor device of claim 3, further comprising:
an input strobe pulse generation circuit configured to generate the input strobe pulse from a command pulse whenever a read operation is performed; and
an output strobe pulse generation circuit configured to generate the output strobe pulse by delaying the command pulse by a read latency whenever the read operation is performed.

5. The semiconductor device of claim 2, wherein the pipe circuit is configured to:
select one of the $K^{th}$ bit and the $(N+K)^{th}$ bit of the latched data according to the logic level of the pre-output control signal and set the selected bit to a $K^{th}$ bit of the pre-output data, and
output the $K^{th}$ bit of the pre-output data as the output data when a $K^{th}$ bit of the output control signal is activated.

6. The semiconductor device of claim 5, wherein the output control circuit is configured to sequentially activate the bits of the output control signal according to the number of times that the output strobe pulse is inputted, wherein the output control signal comprises first to $N^{th}$ bits.

7. The semiconductor device of claim 5, wherein the output control circuit is configured to change the logic level of the pre-output control signal in synchronization with a preset bit among the bits of the output control signal.

8. The semiconductor device of claim 5, wherein the output control circuit comprises:
an output count signal generation circuit configured to sequentially activate the bits of an output count signal by counting the number of times that the output strobe pulse is inputted;
a pre-output control signal generation circuit configured to change the logic level of the pre-output control signal in synchronization with a preset bit among the bits of the output count signal; and
an output control signal generation circuit configured to output the output strobe pulse as one of the bits of the output control signal according to the logic level combination of the output count signal.

9. The semiconductor device of claim 1, wherein the pipe circuit comprises a first pipe latch circuit configured to:
generate a first bit and an $(N+1)^{th}$ bit of the latched data by latching the input data on the basis of a first bit and an $(N+1)^{th}$ bit of the input control signal,
select one of the first and $(N+1)^{th}$ bits of the latched data according to the logic level of the pre-output control signal and set the selected bit to a first bit of the pre-output data, and
output a first bit of the pre-output data as the output data on the basis of a first bit of the output control signal,
wherein N is set to a natural number equal to or greater than 2.

10. The semiconductor device of claim 9, wherein the first pipe latch circuit is configured to:
generate the first bit of the latched data by latching the input data when the first bit of the input control signal is activated, and
set the first bit of the latched data to the first bit of the pre-output data on the basis of the pre-output control signal.

11. The semiconductor device of claim 10, wherein the first pipe latch circuit is configured to:

generate the (N+1)$^{th}$ bit of the latched data by latching the input data, when the (N+1)$^{th}$ bit of the input control signal is activated, and set the (N+1)$^{th}$ bit of the latched data to the first bit of the pre-output data on the basis of the pre-output control signal.

12. The semiconductor device of claim 9, wherein the first pipe latch circuit is configured to output the first bit of the pre-output data as the output data when the first bit of the output control signal is activated, wherein the first bit of the output control signal is activated after a delay time has elapsed from a point in time when one of the first bit and the (N+1)$^{th}$ bit of the input control signal was activated, the delay time being varied according to read latency.

13. The semiconductor device of claim 9, wherein the pipe circuit comprises a second pipe latch circuit configured to:

generate a K$^{th}$ bit and an (N+K)$^{th}$ bit of the latched data by latching the input data on the basis of a K$^{th}$ bit and an (N+K)$^{th}$ bit of the input control signal, set one of the K$^{th}$ and (N+K)$^{th}$ bits of the latched data to a K$^{th}$ bit of the pre-output data according to the logic level of the pre-output control signal, and output the K$^{th}$ bit of the pre-output data as the output data on the basis of a K$^{th}$ bit of the output control signal, wherein K is a natural number equal to or less than N.

14. A semiconductor device comprising:

a first pipe latch circuit configured to:
select one of input data latched in a first node and the input data latched in a second node according to the logic level of a pre-output control signal and set the selected data to a first bit of pre-output data, and
output the first bit of the pre-output data as output data when a first bit of an output control signal is activated;

a second pipe latch circuit configured to:
select one of the input data latched in a third node and the input data latched in a fourth node according to the logic level of the pre-output control signal and set the selected data to a second bit of the pre-output data, and
output the second bit of the pre-output data as the output data when a second bit of the output control signal is activated; and an output control circuit configured to change the logic level of the pre-output control signal in synchronization with the first bit of the output control signal.

15. The semiconductor device of claim 14, wherein the first pipe latch circuit is configured to:
latch the input data in the first node when a first bit of an input control signal is activated, and
latch the input data in the second node when a second bit of the input control signal is activated,
wherein the first bit of the output control signal is activated after a delay time has elapsed from a point in time when one of the first and second bits of the input control signal was activated.

16. The semiconductor device of claim 15, wherein the second pipe latch circuit is configured to:
latch the input data in the third node when a third bit of the input control signal activated, and
latch the input data in the fourth node when a fourth bit of the input control signal is activated,
wherein the second bit of the output control signal is activated after the delay time has elapsed from a point in time when one of the third and fourth bits of the input control signal was activated.

17. A semiconductor device comprising:

a first pipe latch circuit configured to:
select one of input data latched in a first node and the input data latched in a second node according to the logic level of a first pre-output control signal and set the selected data to a first bit of pre-output data, and
output the first bit of the pre-output data as output data when a first bit of an output control signal is activated;

a second pipe latch circuit configured to:
select one of the input data latched in a third node and the input data latched in a fourth node according to the logic level of a second pre-output control signal and set the selected data to a second bit of the pre-output data, and
output the second bit of the pre-output data as the output data when a second bit of the output control signal is activated; and an output control circuit configured to change the logic level of the second pre-output control signal in synchronization with the first bit of the output control signal.

18. The semiconductor device of claim 17, wherein the output control circuit is configured to change the logic level of the first pre-output control signal in synchronization with the second bit of the output control signal.

19. The semiconductor device of claim 17, wherein the first pipe latch circuit is configured to:
latch the input data in the first node when a first bit of an input control signal is activated, and
latch the input data in the second node when a second bit of the input control signal is activated,
wherein the first bit of the output control signal is activated after a delay time has elapsed from a point in time when one of the first and second bits of the input control signal was activated.

20. The semiconductor device of claim 19, wherein the second pipe latch circuit is configured to:
latch the input data in the third node when a third bit of the input control signal is activated, and
latch the input data in the fourth node when a fourth bit of the input control signal is activated,
wherein the second bit of the output control signal is activated after the delay time has elapsed from a point in time when one of the third and fourth bits of the input control signal was activated.

* * * * *